United States Patent [19]

Falater et al.

[11] Patent Number: 4,757,528

[45] Date of Patent: Jul. 12, 1988

[54] THERMALLY COUPLED INFORMATION TRANSMISSION ACROSS ELECTRICAL ISOLATION BOUNDARIES

[75] Inventors: Scott L. Falater, Plymouth, Minn.; Mark A. Snowden, Melbourne, Fla.

[73] Assignee: Harris Corporation, Melbourne, Fla.

[21] Appl. No.: 903,785

[22] Filed: Sep. 5, 1986

[51] Int. Cl.⁴ .................. H01L 31/00; H04M 7/00
[52] U.S. Cl. ................ 379/412; 379/399; 357/28; 507/310
[58] Field of Search ............. 307/310, 307, 303.23; 338/23; 357/28, 49; 337/102, 103; 379/412, 413, 405, 398, 399, 400, 401, 402, 403, 340, 345, 338, 339

[56] References Cited

U.S. PATENT DOCUMENTS

| | | | |
|---|---|---|---|
| 3,258,606 | 6/1966 | Meadows | 307/303 |
| 3,308,271 | 3/1967 | Hilbiber | 219/501 |
| 3,393,328 | 7/1968 | Meadows et al. | 307/310 |
| 3,576,492 | 4/1971 | Rao | 307/310 X |
| 3,621,446 | 11/1971 | Smith et al. | 338/23 |
| 3,794,863 | 2/1974 | Emerson | 307/310 |
| 3,872,418 | 3/1975 | Plough et al. | 338/23 |
| 3,882,728 | 5/1975 | Wittlinger | 307/310 X |
| 4,050,083 | 9/1977 | Jaskolski et al. | 307/310 X |
| 4,099,071 | 7/1978 | Thornburg | 307/239 |
| 4,132,863 | 1/1979 | Smith | 379/400 |
| 4,196,361 | 4/1980 | Nakata | 307/310 |
| 4,257,061 | 3/1981 | Chapel, Jr. et al. | 357/69 |
| 4,289,939 | 9/1981 | Arnold | 379/405 X |
| 4,475,012 | 10/1984 | Coulmance | 379/412 |

FOREIGN PATENT DOCUMENTS 1275110 8/1968 Fed. Rep. of Germany ...... 307/310

OTHER PUBLICATIONS

"Low Cost Controller Stabilizes Heater-Type Cryostats", S. K. Paghadar et al., Electronics, vol. 54, No. 7, Aug. 25, 1981, p. 133.
High Voltage Integrated Circuits for Telecommunications "Extended Abstract of 1981 IEDM", T. Kamei, Hitachi.
"A Monolithic Subscriber Line Interface Circuit", IEEE Journal of Solid-State Circuits", vol. SC-1B, No. 4, Aug. 1981, D. P. Laude.
"Integrated Electronic Subscriber Line Interface Circuit with Ringing on Chip", IEEE Journal of Solid-State Circuits, vol. SC-18, No. 6, Dec. 1981, R. Sirsi et al.
"A Single Chip High-Voltage, Shallow-Junction Borsht-LSI", IEEE of Solid-State Circuits, vol. SC-19, No. 6, Dec. 1984. T. Ohno et al.

Primary Examiner—Jin F. Ng
Assistant Examiner—Randall Vaas
Attorney, Agent, or Firm—Barnes & Thornburg

[57] ABSTRACT

An electro-thermal isolator coupler including a pair of electrically isolated thermal receivers specifically spaced from an electrically isolated thermal transmitter such that their combined signals will produce a thermally compensated electrical output. A second pair of electrically thermal receivers is included in an error circuit which corrects the driver of the thermal transmitter for losses across the thermal coupler. Depending upon the use, the thermal coupler can be used in combination with RF capacitive coupling. Individual power terminals for the electrically isolated regions assure electric isolation.

17 Claims, 5 Drawing Sheets

THERMALLY COUPLED INFORMATION TRANSMISSION ACROSS ELECTRICAL ISOLATION BOUNDARIES

BACKGROUND AND SUMMARY OF THE INVENTION

The present invention relates generally to electrically isolated circuits and more specifically to thermal couplers between electrically isolated integrated circuits.

An electrical isolation boundary is one which does not have direct electrical connections across it but which still allows energy or information transfer across it. They are generally used for safety and interference reasons. Typical examples would include power supplies which run off the wall plug, but have outputs which provide power that is isolated from the wall plug itself. Another example is interfaces to the telephone system. Voice, data, and supervisory functions must be transmitted between the telephone lines and telephone or computing equipment while maintaining a 1000V$_{RMS}$ electrical isolation between them (mandatory by the FCC Part 68 regulations).

There are several methods used to accomplish this type of transmission. Nearly all of them involve conversion of electricity to some other form of energy which is transmitted across the boundary and then reconverted back to an electrical signal. Two very common ones are optoisolators and transformers.

Optoisolators consist of a light emitter and detector that are generally sealed together in a light-tight package. The emitter's light intensity varies according to the amplitude of the electrical drive applied to it and the detector provides an electrical output whose amplitude depends on the light intensity impinging on it. The emitter and detector are manufactured as two separate objects and are then brought together, separated by a transparent or translucent insulating material, such as plastic.

Transformers convert the incoming electrical signal to magnetic energy by means of a coil. A second coil is then brought into the magnetic field by means of physical proximity or by directing the field using a magnetic material or "core". The second coil will produce an electrical output in response to a changing magnetic field intensity.

These methods present some drawbacks in that they cannot be integrated into a chip without using very expensive processing techniques. As a result, they are generally only available in discrete form and thus present economic and volumetric penalties to system designers. The prior arts attempt to integrate these couplers is discussed in "High Voltage Integrated Circuits for Telecommunications" by Tatsuya Kamei;, Extended Abstract of 1981 IEDM.

Thus an object of the present invention is to provide economic coupler integrated with the electrically isolated regions.

Another object of the present invention is to provide a thermal coupler which is integrated with electrically isolated circuits.

A still further object of the present invention is to provide a thermal coupler which is insensitive to ambient temperatures.

A still even further object of the present invention is to provide a thermal coupler which accurately reproduces the transmitted signal.

A still further object of the present invention is to provide a coupling system for electrically isolated circuits capable of coupling low and high frequency transmission signals.

These and other objects of the invention are attained by an electro-thermal isolator having a thermal transmitter in a first dielectrically isolated region generating a thermal signal from an electrical input signal and two thermal receivers in second and third electrically isolated regions for receiving the transmitted thermal signal and generating an electrical output signal. One of the electric output signals is provided to an error detection circuit for comparison with the desired signal and adjusts the generation of the thermally transmitted signal. Each thermal receiver includes a pair of thermally responsive devices both of which are responsive to ambient temperature and one of which is responsive to the transmitted thermal signal and the other being substantially unresponsive to thermally transmitted signal. The thermally responsive devices are connected to a comparator which provides a thermally compensated electrical output signal. To provide total isolation, each of the dielectrically isolated regions include separate power sources.

In an interface integrated circuit, the electro-thermal isolators are used to couple signals between dielectrically isolated ports or sections of the interface circuits and high voltage capacitors are also used to interconnect portions of the circuit in each of the sections. The thermal means couples low frequency signals wherein the capacitors couple high frequency signals. An oscillator provides a carrier signal which is modulated with an input signal to be transmitted capacitively. The two couplers are compatible with isolation above 1,000 volts. The interface circuit may be used in a subscriber-line interface circuit in telephone systems. The voice signal is transmitted via the capacitive coupling whereas control signals are transmitted via the thermal couplers.

These and other objects of the invention will become apparent from the following detailed description when considered with the accompanying drawings.

DETAILED DESCRIPTION OF THE DRAWINGS

Figure 1:
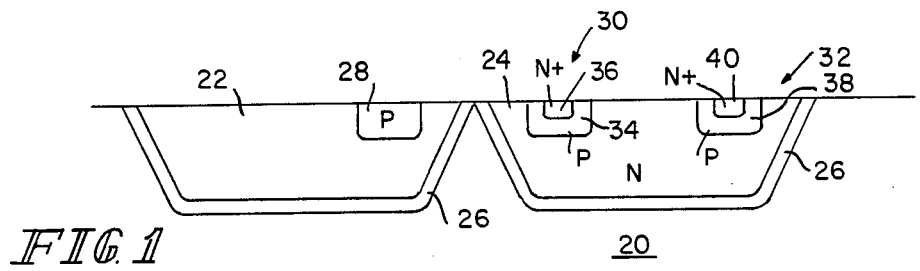
FIG. 1 is a cross-sectional view of an integrated circuit incorporating a thermally compensated electro-thermal isolator in dielectric isolation according to the principles of the present invention.

An electro-thermal isolator or coupler is specifically illustrated in FIG. 1 and includes a support or integrated circuit 20 having N-type regions 22 and 24 dielectrically isolated by dielectric layers 26. A P-type resistor 28 is region 22 functions as a resistive heater or thermal transmitter. A pair of thermally responsive receiver 30 and 32 are formed in dielectrically isolated region 24. Receiver 30, which is adjacent to the heater 28, includes a P-type base region 34 and an N+ emitter region 36. The second thermal receiver 32 includes a P base region 38 and a N+ emitter region 40. The placement of the thermal receivers 30 and 32 are selected such that thermal receiver 30 is responsive to the thermal signal transmitted by thermal transmitter 28 and thermal receiver 32 is substantially unresponsive to the thermal transmission of transmitter 28. Both of the thermal receivers 30 and 32 are responsive to ambient temperature. As will be discussed with respect to FIG. 5 below, a comparison of the response of thermal receivers 30 and 32 produces a thermally compensated output electric signal which is independent of ambient temperatures.

Figure 2:
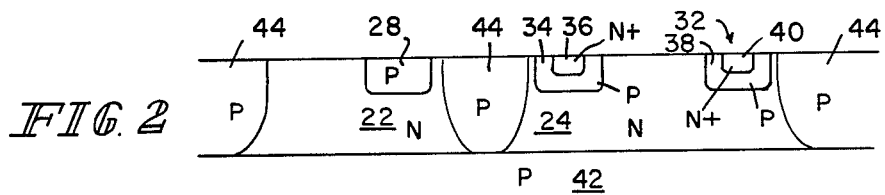
FIG. 2 is a cross-sectional view of an integrated circuit incorporating the principle of the present invention in a junction isolated circuit.

The process that can be used for forming the electro-thermal isolator coupler of FIG. 1 is described in U.S. Pat. No. 4,546,539 to Beasom. This produces a high voltage bipolar process having dielectric isolation capable of withstanding voltage surges above 1,000 volts and within the ±1,500 volt range. Although a resistive transmitter and transistor receiver are illustrated, either the transmitter or the receiver may be a resistor or a transistor which provides a thermal output as a function of the electrical input and provides an electrical output as a function of the thermal inputs. Also it should be noted, that the electro-thermal isolator may be built in junction isolated circuit as illustrated in FIG. 2. The N regions 22 and 24 are provided on a P substrate 42 and have lateral P isolation regions 44. The system of FIG. 2 is operative as long as the substrate 42 is at the most negative voltage encountered.

Figure 3:
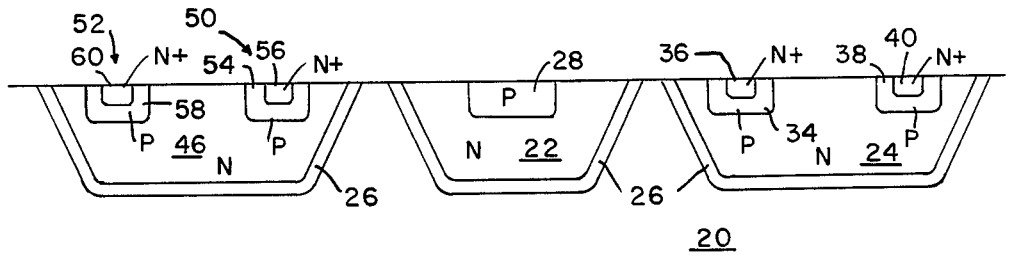
FIG. 3 is a cross-sectional view of an integrated circuit of a thermally compensated electro-thermal isolator including error correction according to the principles of the present invention.

To increase the accuracy of the electro-thermal isolator coupler, two pairs of thermal receivers can be arranged around the thermal transmitter in a thermally symmetrical manner. As illustrated in FIG. 3, the thermal transmitter 28 is surrounded on a second side by a pair of thermal receivers 50 and 52 having the same spacing from the thermal transmitter 28 as thermal receivers 30 and 32 respectively. These thermal receivers 50 and 52 are formed in N type dielectrically isolated region 46. Thermal receiver 50 includes a P-type base region 54 and an N+ emitter region 56. Thermal receiver 52 includes a P base region 58 and an N+ emitter region 60. As with the thermal receivers 30 and 32, thermal receivers 50 and 52 have their output signals compared to provide a temperature compensated electrical output signal. This output signal is used to control the driver of the thermal transmitter 28 such that the electrical output signal of the 50 and 52 matches the input electrical signal for the transmitter 28.

Figure 4:
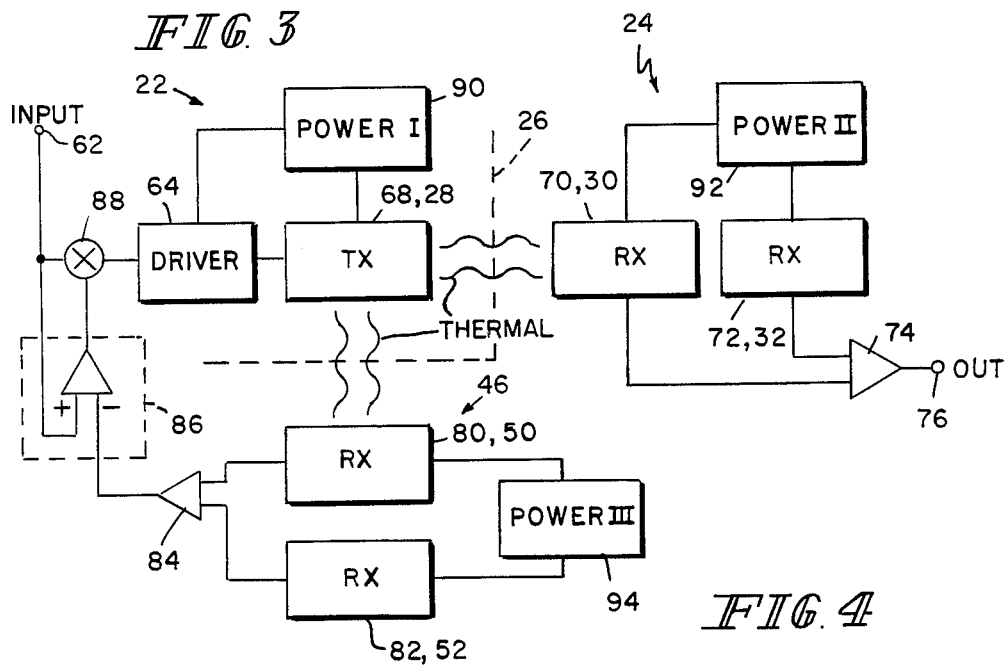
FIG. 4 is a block diagram schematic of an electro-thermal isolator according to the principles of the present invention.

A block diagram illustrating the principles for FIGS. 1 and 3 is illustrated in FIG. 4. The dotted line 26 represents the electrical insulation 26 between the three isolated regions of the substrate 22, 24 and 46. An electrical input signal 62 is provided to driver 64 which drives thermal transmitter 68. Thermal receivers 70 and 72 are positioned such that thermal receiver 70 is substantially more responsive to the thermally transmitted signal from thermal transmitter 68 than is thermal receiver 72. The electrical output signal of the thermal receivers 70 and 72 are provided to a comparator which provides a thermally compensated output electrical signal at output terminal 76. This portion of the circuit corresponds to the integrated circuit of FIG. 1.

For a more accurate isolator coupler, a second pair of thermal receivers 80 and 82 are provided adjacent to the thermal transmitter 68. The electrical output signals of the thermal receivers 80 and 82 are connected to comparator 84 which provides a thermally compensated electrical output signal to error circuit 86. Error circuit 86 compares the input signal on input terminal 62 with the temperature compensated signal from thermal receivers 80 and 82 via comparator 84 to provide an error signal. The input signal 62 and error signal from error circuit 86 are combined at adder 88 and are provided to the driver 64. Thus the transmitter 68 is adjusted to provide the appropriate thermal signal which will be reconverted to an electrical signal accurately duplicating the input electrical signal.

To provide true electrical isolation within the isolator coupler, three power sources 90, 92 and 94 are provided for the transmitter 68, receiver 70, 72 and receiver 80, 82 respectively. As an alternative, the third power source 94 may be deleted and the power for the thermal receivers 80 and 82 can be that of the first power source 90. The error circuit 86 may be provided in the first isolated region 20 or the third isolated region 26.

Figure 5:
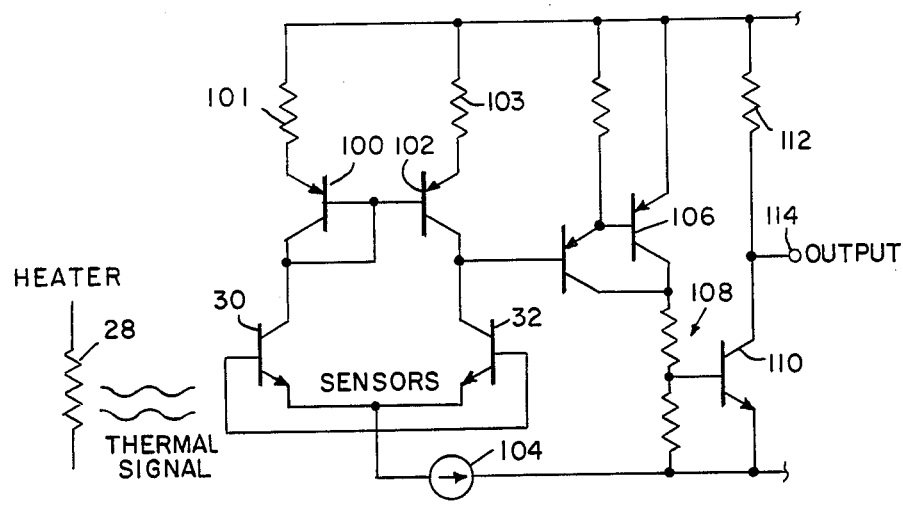
FIG. 5 is an electrical schematic of a thermally compensated electro-thermal isolator according to the principles of the present invention.

A detailed schematic for the integrated circuit of FIG. 1 is illustrated in FIG. 5 showing the heater or resistor 28 thermally transmitting a signal to thermal receivers 30 and 32 illustrated as NPN transistors. Transistors 100 and 102 form a current mirror with the thermal receivers 30 and 32. The bases of the transistors 30 and 32 are connected to a reference voltage VREF, and their emitters are connected to a current source 104. The output of the current mirror is provided to a Darlington amplifier 106 which is in series with a voltage divider 108. An output transistor 110 having its base connected to the voltage divider 108 is in series with the resistor 112. The electrical output signal, which is a temperature compensated signal, is provided on output terminal 114 at the junction of transistor 110 and resistor 112.

Figure 6:
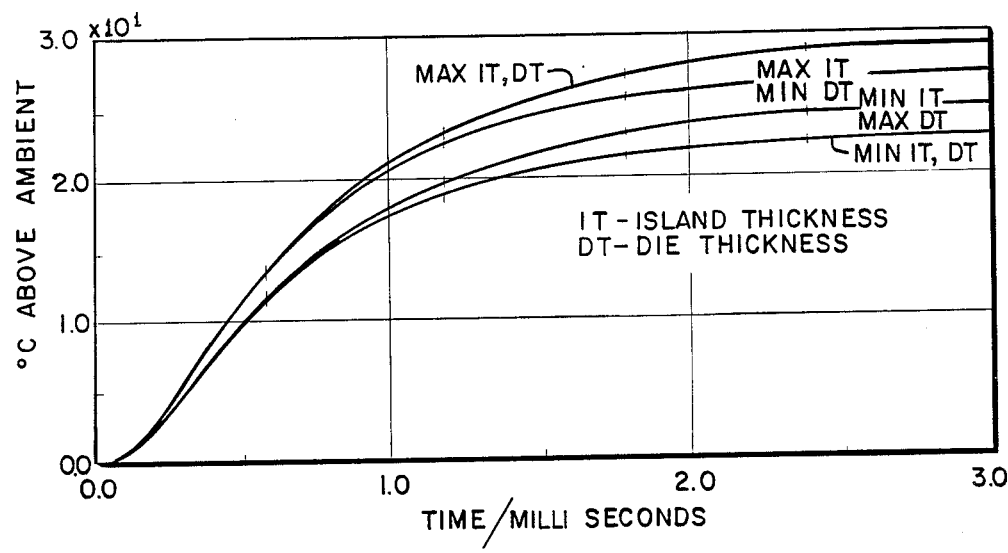
FIG. 6 is a graph of the switching wave forms of the electro-thermal isolator according to the principles of the present invention.
Figure 7:
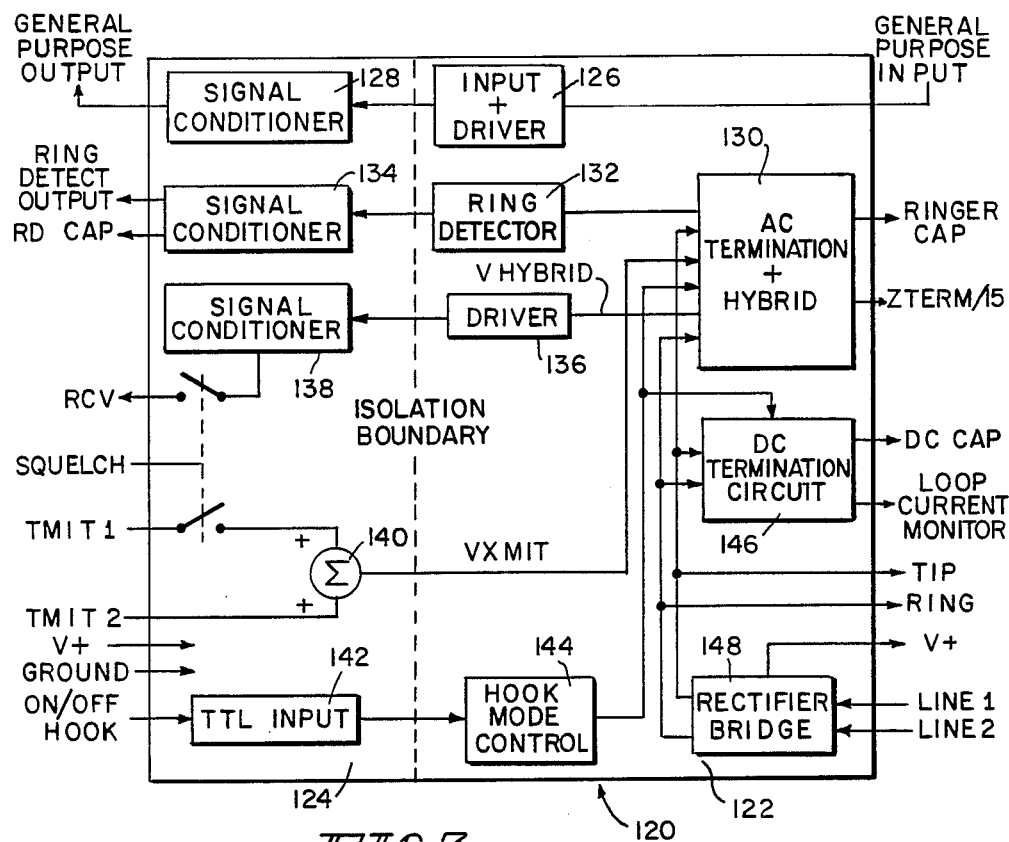
FIG. 7 is a block diagram of a telephone subscriber line interface circuit according to the principles of the present invention.

The differential amplifier formed by transistors 30, 32, 100, 102 and resistors 101 and 103 has an inherent offset due to the intentional mismatch between resistors 101 and 103. This offset causes the Darlington amplifier 106 to be normally on. Power dissipated in the heater resistor 28 will cause a greater junction temperature rise in transistors 30, 102 and resistor 101 as compared to transistors 32, 100 and resistor 103. Once the temperature gradient rises to a high enough value, the inherent offset in the differential amplifier will be overcome and Darlington amplifier 106 will turn off, thus switching the output to a new state. The response of the schematic of FIG. 5 which is a ring detector of FIG. 7 is illustrated in FIG. 6 which shows reliable digital transmission. The graph is temperature in degrees Centigrade above ambient versus time in milliseconds. Experiments show a mean switching power of 135 milliwatts and a mean switching time of 30 milliseconds.

An application for the electro-thermal interface coupler is illustrated in FIG. 7 as a terminating subscriber line interface circuit (TSLIC) 120. It includes a line side 122 dielectrically isolated from the subscriber side 124 on a single chip. TSLIC 120 has been developed for use in terminal equipment and private branch exchanges PBX trunk lines. The main functions provided include AC and DC line termination and impedance matching, two-wire-four-wire hybrid, two-wire-four-wire isolation, ON/OFF hookswitch, ring detection and general purpose detector circuit. The TSLIC 120 differs from previous SLICs in that its power is derived from the line to perform the line interface functions at the subscriber end of the switch telephone network. A 200 volt BVcbo dielectrically isolated bipolar process as described in Beasom U.S. Pat. No. 4,546,539 can be used and provides the necessary separation between the line and terminal equipment. The chip will withstand ±800 volts metallic surges and ±1500 volts lateral surges as required by FCC Part 68 resolution.

TSLIC 120 includes an input and driver 126 for receiving a general purpose input signal and transmitting it to the signal conditioner 128 which provides general purpose output signal. The AC termination hybrid circuit 130 is connected to the ringer capacitor and provides a Z-term divided by 15 output. AC termination hybrid circuit 130 also provides a signal to ringer detector 132 which transmits the signal to signal conditioner 134 which provides a ringer detection output and RD capacitor output on the subscriber side. A driver 136 also connected to the AC termination hybrid circuit 130 provides a signal to signal conditioner 138 which is connected to the receiver line RCV via a switch. The subscriber side includes a pair of transmit lines TMIT1 and TMIT2 connected to a summer 140 whose output is connected to the AC termination hybrid circuit 130. The switch for the RCV line and transmit input TMIT1 is controlled by a squelch signal. The ON/OFF hook signal from the subscriber is provided to a TTL input circuit 140 which communicates with a hook mode control 144 whose output is connected to the AC termination hybrid circuit 130. The output of hook mode control 144 is also connected to the DC termination circuit 146 which is connected to the DC capacitor and the loop current monitor terminals. A rectifier bridge 148 is connected to the power source V+ and line 1 and line 2. Its output is provided to the DC termination circuit 146 and the AC termination hybrid circuit 130. Tip and ring lines are also connected to the AC and DC termination circuits 130 and 146 respectively.

The squelch function allows DTMF signaling through the TSLIC by summing two transmit inputs before they enter the PWM transmit channel. The two transmit inputs pass through unity gain buffers before they are summed at 140. One transmit input TMIT1 is used for normal voice and data communications, while the other TMIT2 can be connected to a DTMF tone generator. The normal transmit TMIT1 and receive RCV paths are squelched with a logic control input while the DTMF signals are sent. This is accomplished by shutting off the filter operational amplifier in the receive path and by turning off the bias current to the first transmit buffer. The squelch input is then returned to its original state to resume normal transmission.

In the TSLIC 120, two distinctive types of information must be transferred across the isolation barrier between line side 122 and subscriber side 124. The low frequency supervisory information is transferred by generating and detecting thermal gradients on the chip and the analog, voice frequency information is transmitted using radio frequency techniques and on-chip capacitors. Low frequency signals are below 200 Hertz and high frequency signals are above 200 Hertz. Thermal transmitters or couplers according to the principles of FIGS. 1 through 5 are used to couple input and driver 126 to signal conditioner 128 and ring detector 132 to signal conditioner 134. The remaining links are the capacitively coupled RF links. Although the on/off hook mode control is a supervisory function and thus a candidate for a thermal coupling, FCC on hook loop current limitation prevent the use of a thermal coupling.

Figure 8:
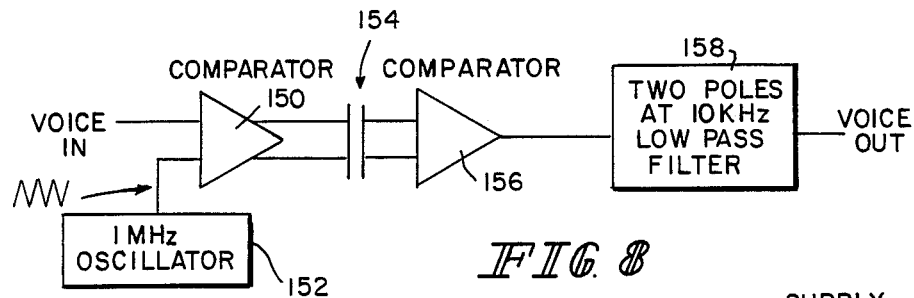
FIG. 8 is a block diagram of the voice transmission link of FIG. 7.

A typical capacitive coupling for the voice signals is illustrated in FIG. 8. Voice input is provided to comparator 150 with an oscillator 152 which provides the carrier signal. The modulated signal, for example pulse width modulation (PWM), from comparator 150 is provided over a pair of high voltage capacitively coupled lines 154 to comparator 156. The differential transmission avoids injecting RF into the lines. The output of comparator 156 is provided through a demodulator low pass filter 158 that produces a voice output signal. Using a 1 Mhz oscillator 152, a four picofarad capacitors 154 are used. This allows using an integrated capacitor. The demodulator/filter 158 can include two operational amplifiers being limited to 100 Khz with a closed loop gain of 10. This provides a two-pole low pass filter at 10 Khz and gives an 80 dB rejection at the carrier frequency.

Figure 9:
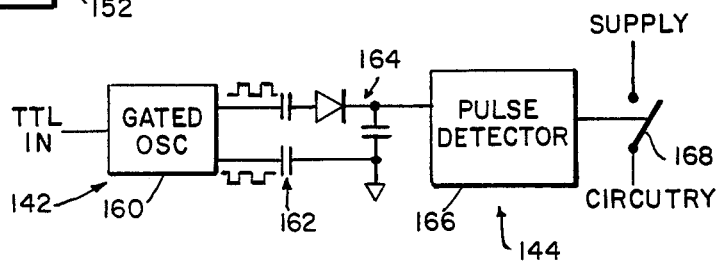
FIG. 9 is a block diagram of the ON/OFF hook detection link of FIG. 7.

Another example of an RF capacitor couple link is illustrated in FIG. 9. A local TTL input is provided to a gated oscillator 160. The output of the gated oscillator 160 is capacitively coupled by lines 162 via a rectifier 164 to pulse detector 166. The output of the pulse detector 166 controls switch 168 that activates the supply for the line powered circuitry. This may be used for the ON/OFF hook transmitter receiver 142 and 144 in FIG. 7.

Figure 10:
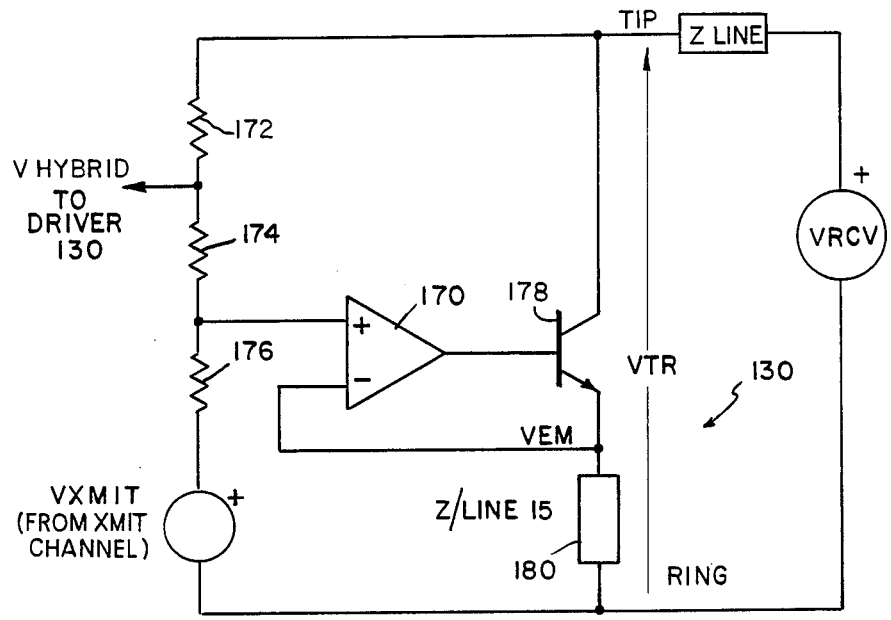
FIG. 10 is an electrical schematic of the AC line termination circuit of FIG. 7.

The TSLIC must present a constant AC impedance across the telephone lines and separate the incoming voice singals from those transmitted by the TSLIC to the central office. These functions are performed by the AC termination and hybrid circuit illustrated in FIG. 10. The AC termination circuit 130 in FIG. 10 includes an operational amplifier 170 having a plus input connected to voltage divider including resistors 172, 174 and 176. This voltage divider is connected between the tip line and the voice transmission signal VXMIT. The voice received signal VHybrid is connected between the resistors 172 and 174. Connected to the output of operational amplifier 170 is transistor 178 which connected in a voltage divider with resistor 180 between the tip and ring lines. The negative input of the operational amplifier 170 is connected between the transistor 178 and resistor 180.

The operational amplifier 170 and transistor 178 form a load across the telephone line which draws a current equal to VEM/(Zline/15). If resistors 172, 174 and 176 are very large compared to all other impedances in the circuit, and the NPN beta of 178 is very large, the following pertains:

VTR=VRCV/2+VXMIT*(1-15)/2 for R172=15 * R174 and R176=(14/16) R174. This shows that the line is properly terminated since VRCV is being equally divided across the line impedance and the TSLIC termination circuit.

The resistor divider also performs the hybrid function, as shown below.

VHybrid=VRCV/(16)

This shows that VXMIT has been cancelled and VHybrid is then transmitted to the four wire side by the receive PWM voice transmission channel. All of this is dependent on how well the Zline/15 network is chosen.

Figure 11:
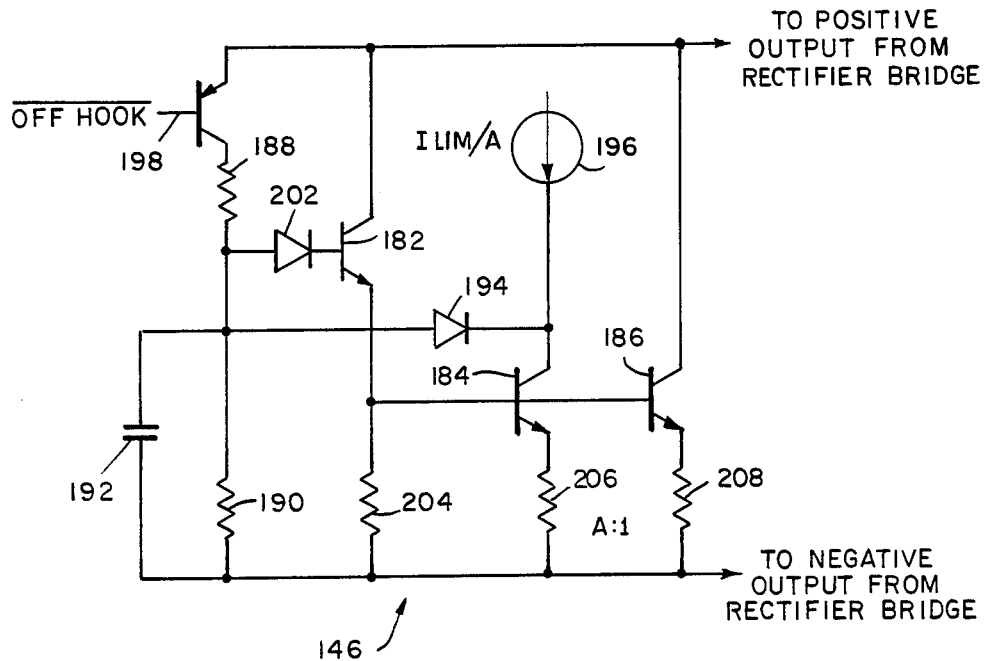
FIG. 11 is an electrical schematic of the DC line termination circuit of FIG. 7.

The DC termination circuit 146 of FIG. 11 includes three NPN transistors 182, 184 and 196. PNP transistor 198 acts as an enabling switch. The emitter collector path of 182 is connected in series with resistor 204 between the positive and negative rectifier lines. The bases of transistors 184 and 186 are connected to the collector of transistor 182. The base of transistor 182 is connected via diode 202 to a voltage divider which includes resistors 188 and 190 and capacitor 192 which is in parallel with resistor 190. Transistor 198 connects the divider to the positive line. A diode 194 connects the base of transistor 182 with the collector of transistor 184. A current source 196 is connected in series with the emitter collector path of transistor 184 and resistor 206 across the positive and negative rectifier lines. The emitter-collector path of transistor 186 is connected in series with resistor 208 between the positive and negative rectifier lines. The DC characteristics to the line of the DC termination 146 is illustrated in FIG. 12.

Once the collector current of transistor 186 exceeds I lim, the collector current in transistor 184 will exceed I lim/A of 196 and thus diode 194 will turn on. This will put the circuit in a current limiting mode.

Figure 12:
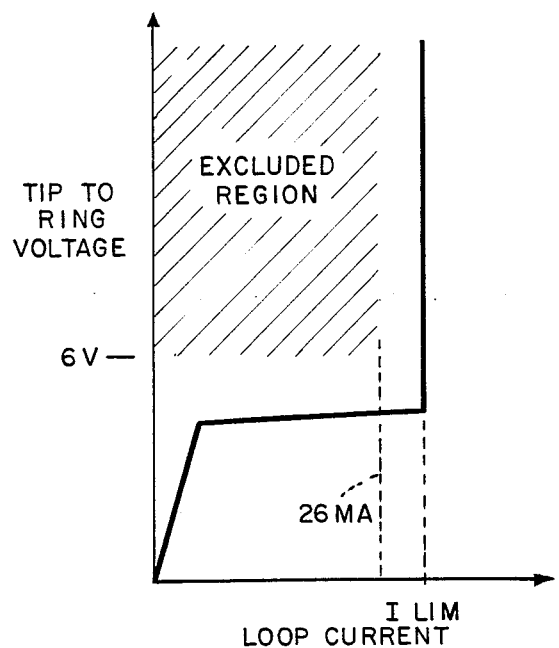
FIG. 12 is a graph of the DC line termination characteristics of the circuit of FIG. 11.
Figure 13:
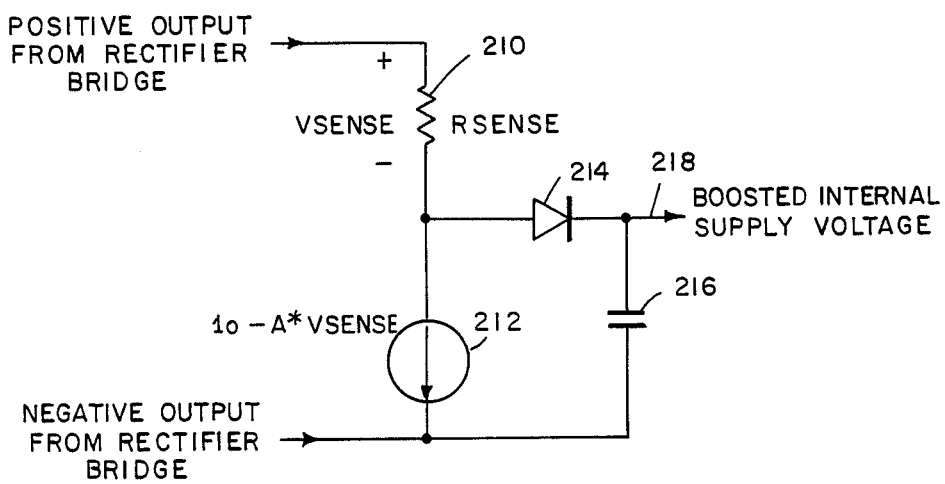
FIG. 13 is an electrical schematic of a voltage booster.

As can be seen from FIG. 12, the TSLIC's telephone line side circuitry must operate with less than 6 volts DC from Tip to Ring. This voltage is reduced by the rectifier bridge 148 in the TSLIC, so that the internal circuitry must operate with an average voltage of about 4 volts in the region below where the DC termination circuit current limits. The problem is compounded by the addition of AC signals on the line which may reach 2.5 volts peak, causing the instantaneous voltage on the circuit side of the rectifier bridge to fall as low as 1.5 volts. The impact was minimized by deriving a boosted supply voltage from the Tip and Ring lines for as much circuitry as possible using the circuit of FIG. 13.

The circuit includes a resistor 210 in series with a current source 212 and connected between the positive and negative rectifier lines. A diode 214 connects the junction of the resistor 210 and current source 212 to the boosted output 218. A capacitor 216 is connected between the booster output 218 and the negative rectifier line. The circuit attempts to maintain a constant current to the resistor 210. This will cancel out the AC current drawn by the rectifier bridge 148 and translates into an apparent high AC impedance across the Tip and Ring lines.

Although the present invention has been described and illustrated in detail, it is to be clearly understood that the same is by way of illustration and example only, and is not to be taken by way of limitation. The spirit and scope of the present invention are to be limited only by the terms of the appended claims.

I claim:

1. An electro-thermal isolator comprising:
    a substrate having first, second and third electrically isolated regions;
    thermal transmitting means in a said first region for receiving an electrical input signal and generating a transmitted thermal signal in response to said electrical input signal;
    first thermal receiving means in said second region for receiving said transmitted thermal signal and generating a first electrical output signal;
    second thermal receiving means in said third region for receiving said transmitted thermal signal and generating a second electrical output signal; and
    error means in said substrate for comparing said second electrical output signal with said electrical input signal and adjusting the generating of said transmitted thermal signal.

2. An electro-thermal isolator as described in claim 1, wherein each thermal receiving means includes a first thermally responsive means responsive to said transmitted thermal signal and ambient temperature, a second thermally responsive means responsive to ambient temperature and substantially unresponsive to said transmitted thermal signal and comparator means for comparing the response of said first and second thermally responsive means and providing a thermally compensated electrical output signal.

3. An electro-thermal isolator as described in claim 1, including a first power terminal connected to said thermal transmitting means and a second power terminal electrically isolated from said first power terminal connected to said first thermal receiving means.

4. An electro-thermal isolator as described in claim 3, wherein said first power terminal is also connected to said second thermal receiving means.

5. An interface integrated circuit comprising:
    first port means, in a first portion of an integrated circuit and including first and second circuits, for receiving and transmitting signals;
    second port means, in a second portion of said integrated circuit and including third and fourth circuits, for receiving and transmitting signals;
    isolation means for electrically isolating said first and second portions of said integrated circuit;
    thermal means including a thermal transmitter and receiver connected to said first and third circuits for thermally coupling said first and third circuits across said isolation means; and
    high voltage capacitor means connected to said second and fourth circuits for electrically coupling said second and fourth circuits across said isolation means.

6. An interface integrated circuit as described in claim 5, wherein said thermal means couples low frequency signals and said capacitor means couples high frequency signals.

7. An interface integrated circuit as described in claim 5, wherein said low frequency signals are below 200 Hertz and said high frequency signals are above 200 Hertz.

8. An interface integrated circuit as described in claim 5, wherein said first port means includes a first power terminal and said second port means includes a second power terminal isolated electrically from said first power terminal.

9. An interface integrated circuit as described in claim 5, wherein said thermal transmitter includes heating means in said integrated circuit; and said thermal receiver includes a first thermally responsive means responsive to said heating means and ambient temperature, a second thermally responsive means responsive to ambient temperature and substantially unresponsive to said heating means and comparator means for comparing the response of said first and second thermally responsive means and providing a first thermally compensated received signal.

10. An interface integrated circuit as described in claim 9, including:
   a second said thermal receiver in a third electrically isolated portion of said integrated circuit, and said second thermal receiver includes a third thermally responsive means responsive to said heating means and ambient termperature, a fourth thermally responsive means responsive to ambient termperature and substantially unresponsive to said heating means and a second comparator means for comparing the response of said third and fourth thermally responsive means and providing a second thermally compensated received signal; and
   an error means in said first port means for comparing said second thermally compensated received signal with a desired signal and adjusting the output of said heating means.

11. An interface integrated circuit as described in claim 5, wherein said isolation means provides isolation for voltage surges above 1,000 volts.

12. A subscriber-line interface circuit comprising:
   a substrate having a subscriber portion and a line portion electrically isolated from each other;
   first transmitter means in said line portion for receiving a first analog input signal and generating a first high frequency transmitted electrical signal;
   first receiver means in said subscriber portion for receiving said first transmitted electrical signal said first transmitter means and generating a first analog output signal;
   first high voltage capacitor means for electrically coupling said first transmitter and receiver means across said isolation;
   second transmitter means in said line portion for receiving a second input signal and generating a first transmitted thermal signal; and
   second receiver means in said subscriber portion for receiving said first transmitted thermal signal and generating a second output signal.

13. A subscriber-line interface circuit as described in claim 12, including:

third transmitter means in said subscriber portion for receiving a third analog input signal and generating a third high frequency transmitted electrical signal;
third receiver means in said line portion for receiving said third transmitted electrical signal and generating a third analog output signal;
second high voltage capacitor means for electrically coupling said third transmitter and receiver means across said isolation;
fourth transmitter means in said subscriber portion for receiving a fourth input signal and generating a fourth transmitted thermal signal; and
fourth receiver means in said line portion for receiving said fourth transmitter thermal signal and generating a fourth output signal.

14. A subscriber-line interface circuit as described in claim 12, including a first power terminal connected to said line portion and second power terminal electrically isolated from said first power terminal and connected to said subscriber portion.

15. A subscriber-line interface circuit as described in claim 12, wherein said second receiving means includes a first thermally responsive means responsive to said first transmitted thermal signal and ambient temperature, a second thermally responsive means responsive to ambient temperature and substantially unresponsive to said first transmitted thermal signal and comparator means for comparing the response of said first and second thermally responsive means and providing a thermally compensated electrical output signal.

16. A subscriber-line interface circuit as described in claim 15, including in a third electrically isolated portion of said substrate a third receiver in a third electrically isolated portion of said integrated circuit, and said third receiver includes a third thermally responsive means responsive to said first transmitted thermal signal and ambient temperature, a fourth thermally responsive means responsive to ambient temperature and substantially unresponsive to said first transmitted thermal signal and a second comparator means for comparing the response to said third and fourth thermally responsive means and providing a second thermally compensated received signal; and
   an error means in said second transmitter means for comparing said second thermally compensated received signal with said second input signal and adjusting generating of said first transmitted thermal signal.

17. A subscriber-line interface circuit as described in claim 12, wherein:
   said first transmitter means includes oscillator means for generating a high frequency carrier signal and modulation means for combining said high frequency carrier signal and said first analog input signal as said first transmitted electrical signal; and
   said first receiver means includes demodulation means for removing said high frequency carrier signal from said first transmitted electrical signal.

* * * * *